(12) United States Patent
Zhu et al.

(10) Patent No.: US 8,841,688 B2
(45) Date of Patent: *Sep. 23, 2014

(54) LIGHT EMITTING DIODE

(71) Applicants: Tsinghua University, Beijing (CN); Hon Hai Precision Industry Co., Ltd., New Taipei (TW)

(72) Inventors: Jun Zhu, Beijing (CN); Hao-Su Zhang, Beijing (CN); Zhen-Dong Zhu, Beijing (CN); Qun-Qing Li, Beijing (CN); Guo-Fan Jin, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/729,570

(22) Filed: Dec. 28, 2012

(65) Prior Publication Data

US 2013/0328076 A1 Dec. 12, 2013

(30) Foreign Application Priority Data

Jun. 7, 2012 (CN) .......................... 2012 1 0185710

(51) Int. Cl.
*H01L 33/44* (2010.01)

(52) U.S. Cl.
USPC .............................................. 257/98; 257/99

(58) Field of Classification Search
USPC .................. 257/98, 99; 362/308, 309, 311.02
See application file for complete search history.

(56) References Cited

U.S. PATENT DOCUMENTS

| | | | |
|---|---|---|---|
| 8,159,000 B2 * | 4/2012 | Lee et al. | 257/99 |
| 8,183,591 B2 * | 5/2012 | Kim | 257/99 |
| 2010/0123166 A1 * | 5/2010 | Bae | 257/103 |
| 2012/0113656 A1 * | 5/2012 | Iwanaga et al. | 362/382 |
| 2013/0328076 A1 * | 12/2013 | Zhu et al. | 257/94 |
| 2013/0328079 A1 * | 12/2013 | Zhang et al. | 257/98 |
| 2013/0328080 A1 * | 12/2013 | Zhang et al. | 257/98 |
| 2013/0328081 A1 * | 12/2013 | Zhang et al. | 257/98 |
| 2013/0328083 A1 * | 12/2013 | Zhu et al. | 257/98 |
| 2013/0328084 A1 * | 12/2013 | Zhu et al. | 257/98 |
| 2013/0330859 A1 * | 12/2013 | Zhang et al. | 438/29 |
| 2013/0330860 A1 * | 12/2013 | Zhang et al. | 438/29 |
| 2013/0330861 A1 * | 12/2013 | Zhu et al. | 438/29 |
| 2013/0330862 A1 * | 12/2013 | Zhu et al. | 438/29 |
| 2013/0330863 A1 * | 12/2013 | Zhu et al. | 438/29 |
| 2013/0330864 A1 * | 12/2013 | Zhu et al. | 438/29 |

\* cited by examiner

*Primary Examiner* — Earl Taylor
(74) *Attorney, Agent, or Firm* — Novak Druce Connolly Bove + Quigg LLP

(57) ABSTRACT

A light emitting diode includes a first semiconductor layer, an active layer, a second semiconductor layer, a first optical symmetric layer, a metallic layer, and a second optical symmetric layer stacked in that sequence. A first electrode is electrically connected to the first semiconductor layer, and a second electrode is electrically connected to the second semiconductor layer. A first effective refractive index $n_1$ of the second optical symmetric layer and a second effective refractive index $n_2$ of an integrated structure satisfy $|n_1-n_2| \leq 0.5$, wherein the integrated structure includes the substrate, the first semiconductor layer, the active layer, the second semiconductor layer, and the first optical symmetric layer.

20 Claims, 12 Drawing Sheets

US 8,841,688 B2

LIGHT EMITTING DIODE

CROSS-REFERENCE TO RELATED APPLICATIONS

This application claims all benefits accruing under 35 U.S.C. §119 from China Patent Application No. 201210185710.7, filed on Jun. 7, 2012, in the China Intellectual Property Office, the contents of which are hereby incorporated by reference. This application is related to commonly-assigned applications entitled, "SEMICONDUCTOR STRUCTURE", filed Dec. 28, 2012 Ser. No. 13/729,538; "METHOD FOR MAKING LIGHT EMITTING DIODE", filed Dec. 28, 2012 Ser. No. 13/729,554, the contents of the above commonly-assigned applications are hereby incorporated by reference.

BACKGROUND

1. Technical Field

The present disclosure relates to semiconductor structures, a light emitting diode, and a method for making the same.

2. Description of Related Art

Semiconductor structures fabricated by gallium nitride for light sources, such as blue, green, and white light sources, have long lifetime, high energy conversion efficiency, and is environmentally friendly. Therefore, the semiconductor structures are widely used as the light sources in large screen color display systems, automotive lighting, traffic lights, multimedia displays, optical communication systems, and so on.

A semiconductor structure used in a standard light emitting diode (LED) includes an N-type semiconductor layer, a P-type semiconductor layer, and an active layer located between the N-type semiconductor layer and the P-type semiconductor layer. In an operation, a positive voltage and a negative voltage are applied respectively to the P-type semiconductor layer and the N-type semiconductor layer. Thus, holes in the P-type semiconductor layer and electrons in the N-type semiconductor layer can enter the active layer and combine with each other to emit visible light, and the visible light is emitted from the semiconductor structure. However, near field evanescent waves emitted from the active layer are internally reflected inside the semiconductor structure, so that a large portion of the light emitted from the active layer remain in the semiconductor structure, thereby degrading the light extraction efficiency of LED.

What is needed, therefore, is to provide a semiconductor structure for solving the problem discussed above.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
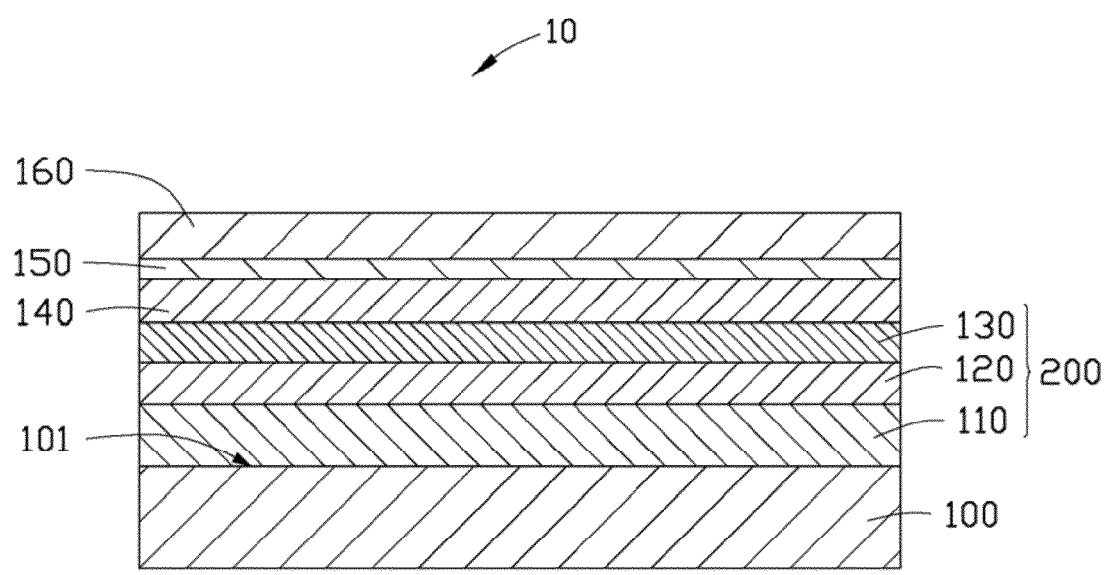
FIG. 1 is a schematic sectional view of one embodiment of a semiconductor structure.

Referring to FIG. 1, one embodiment of a semiconductor structure 10 includes a substrate 100 having an epitaxial growth surface 101, a composite semiconductor layer 200, a first optical symmetric layer 140, a metallic layer 150, and a second optical symmetric layer 160. The composite semiconductor layer 200, the first optical symmetric layer 140, the metallic layer 150, and the second optical symmetric layer 160 are stacked on the epitaxial growth surface 101 in that sequence. The composite semiconductor layer 200 includes a first semiconductor layer 110, an active layer 120, and a second semiconductor layer 130. The first semiconductor layer 110 is adjacent to the substrate 100. An effective refractive index of the second optical symmetric layer 160 is defined as the first effective refractive index $n_1$. An effective refractive index of an integrated structure including the substrate 100, the composite semiconductor layer 200, and the first optical symmetric layer 140 is defined as the second effective refractive index $n_2$. A difference $\Delta n$ between the $n_1$ and $n_2$ is less than and equal to 0.5, wherein $\Delta n = |n_1 - n_2|$.

The substrate 100 can be a transparent structure having an epitaxial growth surface 101 used to grow the first semiconductor layer 110. The epitaxial growth surface 101 is a smooth surface. Oxygen and carbon are removed from the epitaxial growth surface 101. The substrate 100 can be a single layer structure or a multiple layer structure. If the substrate 100 is a single layer structure, the substrate 100 can be a single-crystal structure. The single-crystal structure includes a crystal face which is used as the epitaxial growth surface 101. A material of the substrate 100 can be silicon on insulator (SOI), LiGaO2, LiAlO2, Al2O3, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. If the substrate 100 is the multiple layer structure, the substrate 100 should include at least one layer of the single-crystal structure mentioned previously. The material of the substrate 100 can be selected according to the first semiconductor layer 110. In one embodiment, a lattice constant and thermal expansion coefficient of the substrate 100 is similar to the first semiconductor layer 110 thereof in order to improve a quality of the first semiconductor layer 110. In one embodiment, the material of the substrate 100 is sapphire. A thickness, shape, and size of the substrate 100 are arbitrary and can be selected according to need.

A thickness of the first semiconductor layer 110 can be in a range from about 1 micrometer to about 15 micrometers. The first semiconductor layer 110 can be a doped semiconductor layer. The doped semiconductor layer can be an N-type semiconductor layer or a P-type semiconductor layer. A material of the N-type semiconductor layer can be at least one of N-type GaN, N-type GaAs, and N-type cupric phosphide. A material of the P-type semiconductor layer can be at least one of P-type GaN, P-type GaAs, and P-type cupric phosphide. The N-type semiconductor layer is configured to provide electrons, and the P-type semiconductor layer is configured to provide holes. In one embodiment, the material of the first semiconductor layer 110 is the N-type GaN doped with Si element, and the thickness of the first semiconductor layer 110 is about 1460 nanometers.

The active layer 120 is a photon excitation layer to provide a location for the combination of the electrons and holes. Photons are produced in the active layer 120 when the electrons and holes are combined. The active layer 120 can be one of a single layer quantum well film or multilayer quantum well film. A material of the quantum well film can be at least one of GaInN, AlGaInN, GaAs, GaAlAs, GaInP, InAsP, and InGaAs. A thickness of the active layer 120 can be in a range from about 0.01 micrometers to about 0.6 micrometers. In one embodiment, the material of the active layer 120 is a composition of InGaN and GaN, and the thickness of the active layer 120 is about 10 nanometers.

The second semiconductor layer 130 can be the N-type semiconductor layer or the P-type semiconductor layer. The type of the first semiconductor layer 110 and the type of the second semiconductor layer 130 is different to form a PN conjunction. The second semiconductor layer 130 is disposed on the active layer 120. A thickness of the second semiconductor layer 130 ranges from about 5 nanometers to about 250 nanometers. In one embodiment, the thickness of the second semiconductor layer 130 ranges from about 10 nanometers to about 200 nanometers. In one embodiment, the thickness of the second semiconductor layer 130 is in a range from about 10 nanometers to about 30 nanometers. The thickness of the second semiconductor layer 130 can be about 10 nanometers, 50 nanometers, 100 nanometers, or 200 nanometers. In one embodiment, the second semiconductor layer 130 is the P-type GaN doped with Mg element, and the thickness of the second semiconductor layer 130 is about 10 nanometers. In one embodiment, the refractive index of the composite semiconductor layer 200 is about 2.5.

The first optical symmetric layer 140 is disposed on the second semiconductor layer 130. The first optical symmetric layer 140 is sandwiched between the second semiconductor layer 130 and the metallic layer 150. The material of the first optical symmetric layer 140 can be selected according to need, and a refractive index of the first optical symmetric layer 140 is smaller than a refractive index of the composite semiconductor layer 200. In one embodiment, the refractive index of the first optical symmetric layer 140 can be in a range from about 1.2 to about 1.8. In one embodiment, the refractive index of the first optical symmetric layer 140 is in a range from about 1.3 to about 1.4. In one embodiment, the refractive index of the first optical symmetric layer 140 is in a range from about 1.4 to about 1.5. A material of the first optical symmetric layer 140 can be silicon dioxide, magnesium fluoride, or lithium fluoride. The difference between the refractive index of the first optical symmetric layer 140 and the refractive index of the composite semiconductor layer 200 is greater than 0.7, such as about 1, about 1.1, about 1.2, about 1.3, about 1.4, or about 1.5. In one embodiment, the material of the first optical symmetric layer 140 is the silicon dioxide, and the refractive index of the first optical symmetric layer 140 is about 1.5.

The first optical symmetric layer 140 can prevent the metallic plasma generated by the metallic layer 150 from being converted to heat. The refractive index of the metallic layer 150 under a guided wave mode is a complex number including a real part and an imaginary part. If the imaginary part is large, the metallic plasma is easily converted to heat. Thus, the first optical symmetric layer 140 made of a material with a low refractive index can reduce the real part and the imaginary part at the same time. The lower the refractive index of the first optical symmetric layer 140, the greater the difference between the refractive index of the first optical symmetric layer 140 and the refractive index of the composite semiconductor layer 200. Thus, the heat consumption of the metallic plasma can be reduced, and the metallic plasma can travel farther. Therefore, the extraction efficiency of the semiconductor structure 10 can be increased.

A thickness of the first optical symmetric layer 140 can be in a range from about 5 nanometers to about 40 nanometers. In one embodiment, the thickness of the first optical symmetric layer 140 is in a range from about 5 nanometers to about 10 nanometers. In another embodiment, the thickness of the first optical symmetric layer 140 is in a range from about 10 nanometers to about 20 nanometers. In yet another embodiment, the thickness of the first optical symmetric layer 140 is in a range from about 20 nanometers to about 30 nanometers. In another embodiment, the thickness of the first optical symmetric layer 140 is in a range from about 30 nanometers to about 40 nanometers. The thinner the first optical symmetric layer 140, the closer the metallic layer 150 and active layer 120. Therefore, the interaction between the metallic layer 150 and the active layer 120 will be improved, and more photons will be generated by the active layer 120. In one embodiment, the thickness of the first optical symmetric layer 140 is about 20 nanometers.

A material of the metallic layer 150 can be selected according to need, to ensure that the metallic layer 150 can generate metallic plasma. Therefore, the material of the metallic layer 150 is metallic in optics. Furthermore, the material of the metallic layer 150 can satisfy the following requirements. First, the refractive index of the metallic layer 150 is a complex number including a real part and an imaginary part, and the imaginary part cannot be zero. Second, a dielectric constant of the metallic layer 150 is a complex number including a real part and an imaginary part, and the real part is a negative number.

The material of the metallic layer 150 can be a pure metal or an alloy, thus lights with long wavelengths can be extracted from the active layer 120. The metal can be silver, aluminum, copper, or gold. The alloy can be gold-silver alloy, gold-aluminum alloy, or silver-aluminum alloy. In one embodiment, the material of the metallic layer 150 is silver. A thickness of the metallic layer 150 can be in a range from about 10 nanometers to about 30 nanometers, such as about 15 nanometers, about 20 nanometers, about 25 nanometers. The thickness of the metallic layer 150 can be selected to ensure that the photons generated by the active layer 120 can be extracted out, and the heat consumption can be reduced. In one embodiment, the thickness of the metallic layer 150 is about 15 nanometers.

The metallic layer 150 has many functions. Near field evanescent waves generated by the active layer 120 can be amplified and converted to metallic plasma by the metallic layer 150, when arriving at the metallic layer 150. The metallic plasma can be extracted out from of the semiconductor structure 10. A few metallic plasma can be scattered by the metallic layer 150 and spread around the metallic layer 150. While the metallic plasma reaches the active layer 120, the metallic plasma can interact with the quantum well in the active layer 120 to activate more secondary photons. The secondary photons can also arrive at the metallic layer 150 and introduce more metallic plasma. Thus more photons can be extracted out of the semiconductor structure 10 under the interaction between the metallic layer 150 and the active layer 120. Furthermore, the uniformity of the current distributed in the second semiconductor layer 130 can be improved.

The second optical symmetric layer 160 is disposed on and directly contacts the metallic layer 150. A refractive index of the second optical symmetric layer 160 can range from about 1.2 to about 3.5. In one embodiment, the refractive index of the second optical symmetric layer 160 ranges from about 1.8 to about 2.5. In one embodiment, the refractive index of the second optical symmetric layer 160 ranges from about 2.5 to about 3.4. A material of the second optical symmetric layer 160 can be dioxide, hafnium oxide, zirconia, yttria, or polyimide. The effective refractive index on the two opposite surfaces of the metallic layer 150 is similar. While a plurality of layers is stacked together, the "effective refractive index" is deduced from the dispersion equation based on the refractive index and thickness of each of the plurality of layers. In one embodiment, the first effective refractive index $n_1$ of the second optical symmetric layer 160 is deduced from the dispersion equation based on the second optical symmetric layer 160 and the environment. The environment can be atmosphere, vacuum, or dielectric material. The second effective refractive index $n_2$ is deduced from the dispersion equation based on the substrate 100, the composited semiconductor layer 200, and the first optical symmetric layer 140. The difference $\Delta n$ between $n_1$ and $n_2$ satisfy $0 \leq \Delta n \leq 0.5$, wherein $\Delta n = |n_1 - n_2|$. In one embodiment, the difference $\Delta n$ can satisfy $0 \leq \Delta n \leq 0.3$. The smaller the $\Delta n$, the greater the light extractive efficiency of the semiconductor structure 10.

The thickness of the second optical symmetric layer 160 can be selected according to the refractive index of the second optical symmetric layer 160. If the refractive index of the second symmetric layer 160 is greater than the refractive index of the composite semiconductor layer 200, the thickness of the second symmetric layer 160 can range from about 0.5 nanometers to about 9 nanometers. The difference $\Delta n_1$ between the refractive index of the second symmetric layer 160 and that of the composite semiconductor layer 200 is greater than 0.7 and smaller than 6.0. In one embodiment, the difference $\Delta n_1$ is greater than 0.8 and smaller than 5.0. In one embodiment, the difference $\Delta n_1$ is greater than 0.9 and smaller than 4.0. In one embodiment, the difference $\Delta n_1$ is greater than 1.0 and smaller than 3.0. The greater the refractive index of the second optical symmetric layer 160, the thinner the thickness of the second optical symmetric layer 160. Thus the light extractive efficiency can be improved.

If the refractive index of the second optical symmetric layer 160 is smaller than the refractive index of the composite semiconductor layer 200, the thickness of the second symmetric layer 160 can range from about 50 nanometers to about 5 micrometers. The refractive index of the second optical symmetric layer 160 can range from about 1.2 to about 2.5. In one embodiment, the refractive index of the second optical symmetric layer 160 can range from about 1.8 to about 2.0. In one embodiment, the thickness of the second optical symmetric layer 160 can range from about 50 nanometers to about 300 nanometers. The smaller the refractive index of the second optical symmetric layer 160, the greater the thickness of the second optical symmetric layer 160. If the effective refractive indexes on the two opposite surfaces of the metallic layer 150 are similar, the semiconductor structure 10 is a semi-symmetrical waveguide structure.

Furthermore, a buffer layer (not shown) can be sandwiched between the substrate 100 and the first semiconductor layer 110 to reduce the stress force between them. Thus the quality of the first semiconductor layer 120 can be improved.

Figure 2:
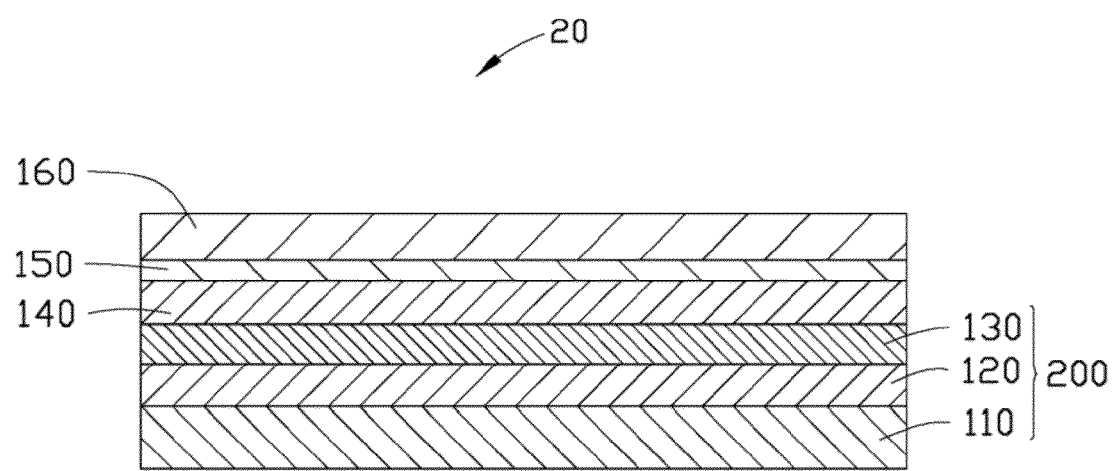
FIG. 2 is a schematic sectional view of one embodiment of a semiconductor structure.

Also referring to FIG. 2, one embodiment of a semiconductor structure 20 is provided. The semiconductor structure 20 includes a first semiconductor layer 110, an active layer 120, a second semiconductor layer 130, a first optical symmetric layer 140, a metallic layer 150, and a second optical symmetric layer 160 stacked in that order. The semiconductor structure 20 is similar to the semiconductor structure 10, except that the substrate is omitted. The effective refractive index $n_1$ of the second optical symmetric layer 160 is similar to the effective refractive index $n_2$ of an integrated structure including the first semiconductor layer 110, the active layer 120, the second semiconductor layer 130, and the first optical symmetric layer 140. A difference $\Delta n$ between the $n_1$ and $n_2$ is greater than and equal to 0 and smaller than 0.5.

Figure 3:
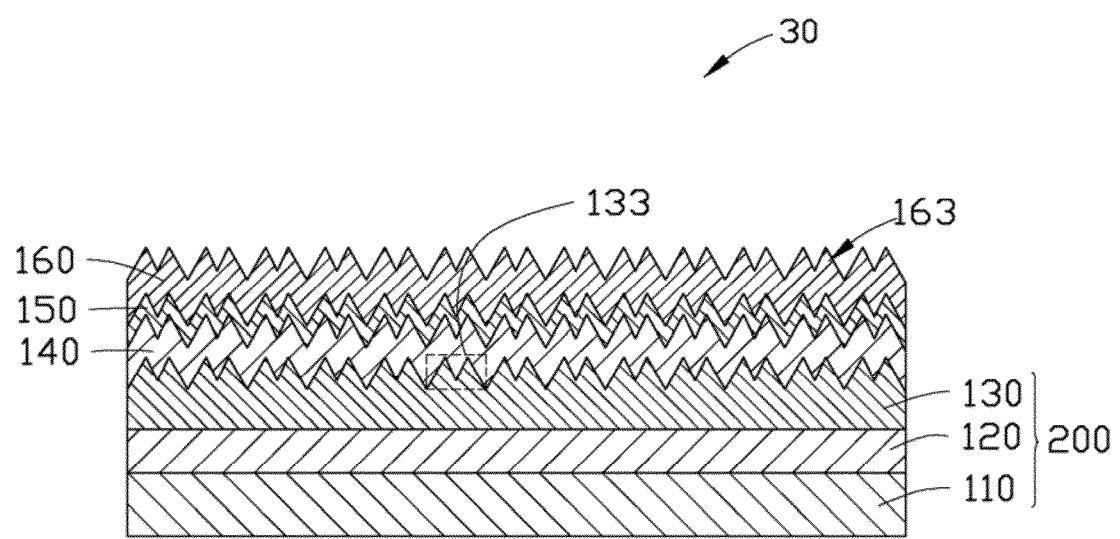
FIG. 3 is a schematic sectional view of one embodiment of a semiconductor structure.

Referring to FIG. 3, one embodiment of a semiconductor structure 30 is provided. The semiconductor structure 20 includes a first semiconductor layer 110, an active layer 120, a second semiconductor layer 130, a first optical symmetric layer 140, a metallic layer 150, and a second optical symmetric layer 160 stacked in that order. The semiconductor structure 30 is similar to the semiconductor structure 20, except that the second semiconductor layer 130 includes a plurality of three-dimensional nano-structures 133 at a surface away from the active layer 120.

Figure 4:
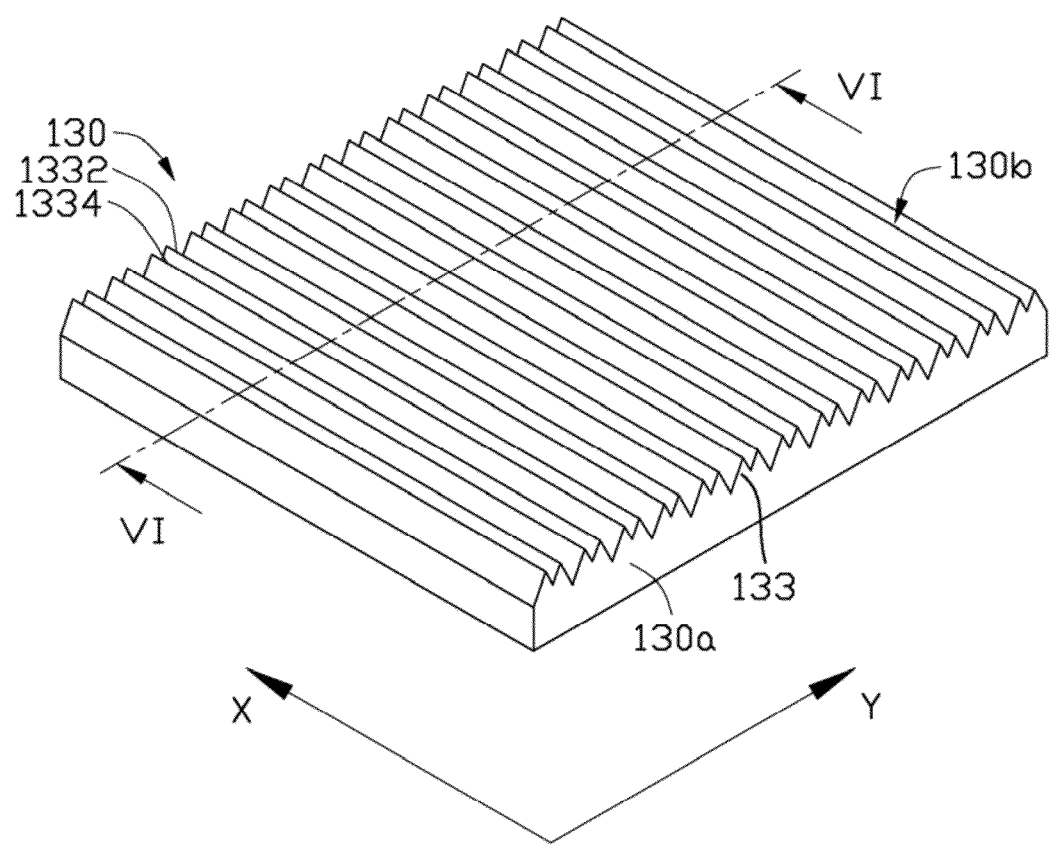
FIG. 4 is a schematic sectional view of one embodiment of three dimensional structure array of FIG. 3.

Also referring to FIG. 4, the second semiconductor layer 130 can be separated into a main body 130a and a protruding part 130b and distinguished by an "interface." The interface can be substantially parallel with the first surface of the second semiconductor layer 130. The interface is configured as a surface of the main body 130a, and the protruding part 130b is extending away from the interface. The protruding part 130b defines the plurality of three-dimensional nano-structures 133, and the plurality of three-dimensional nano-structures 133 form the patterned surface of the second semiconductor layer 130. The three-dimensional nano-structure 133 can be a protruding structure. The protruding structure protrudes out from the interface of the main body 130a. The plurality of three-dimensional nano-structures 133 is a protruding structure located on the interface of the main body 130a.

Figure 5:
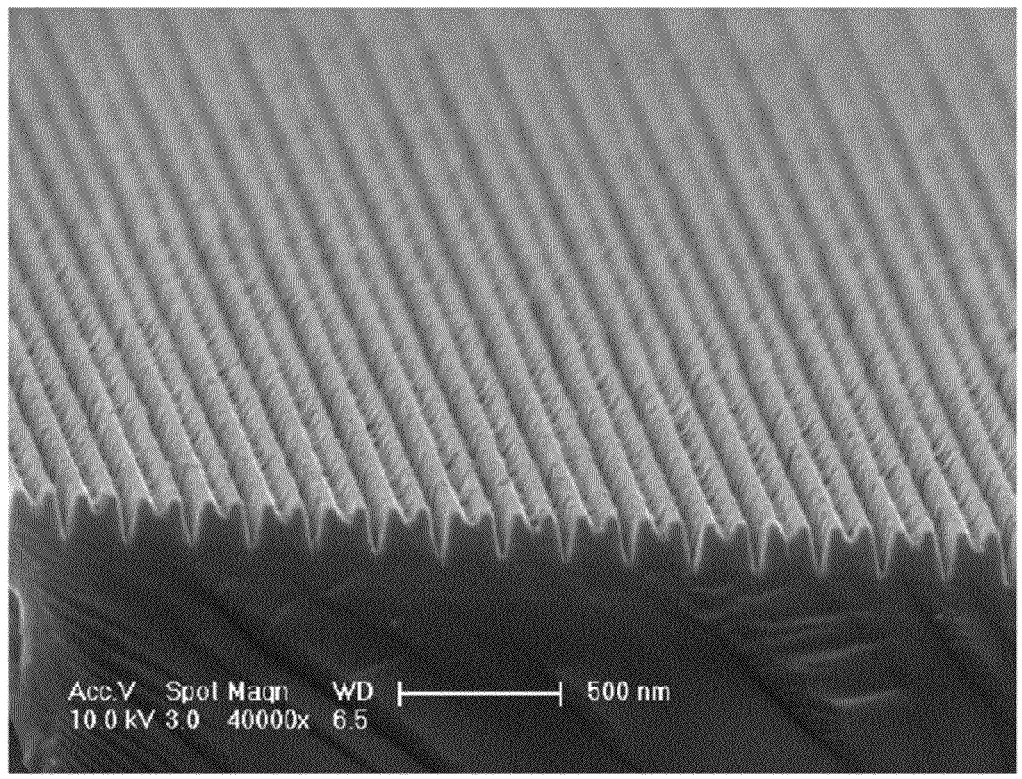
FIG. 5 is a scanning electron microscope (SEM) image of FIG. 4.
Figure 6:
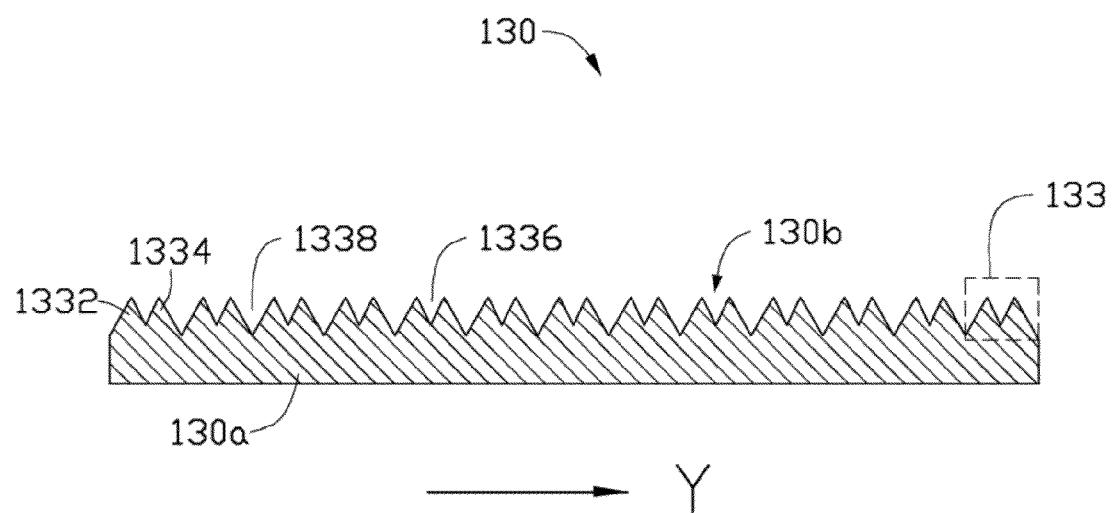
FIG. 6 shows cross-sectional view along a line VI-VI of FIG. 4.

The plurality of three-dimensional nano-structures 133 can be arranged side by side. Each of the three-dimensional nano-structures 133 can extend along a straight line, a curvy line, or a polygonal line. The extending direction is substantially parallel with the surface of the second semiconductor layer 130. The two adjacent three-dimensional nano-structures are arranged a certain distance apart from each other. The distance ranges from about 0 nanometers to about 1000 nanometers, such as about 10 nanometers, about 30 nanometers, or about 200 nanometers. The extending direction of the three-dimensional nano-structure 133 can be fixed or varied. While the extending direction of the three-dimensional nano-structure 133 is fixed, the plurality of three-dimensional nano-structures 133 extends along a straight line. Otherwise, the three-dimensional nano-structures 133 extends along a polygonal line or a curvy line. The cross-section of the three-dimensional nano-structure 133 along the extending direction is M-shaped. Referring to FIG. 5 and FIG. 6, the three-dimensional nano-structures 133 are a plurality of substantially parallel bar-shaped protruding structures extending along a straight line. The plurality of three-dimensional nano-structures 133 are substantially uniformly and equidistantly distributed on the entire surface of the main body 130a.

The three-dimensional nano-structure 133 extends from one side of the semiconductor layer 110 to the opposite side along the X direction. The Y direction is substantially perpendicular to the X direction and substantially parallel with the surface of the main body 130a. The three-dimensional nano-structure 133 is a double-peak structure including two peaks. The cross-section of the double-peak structure is in the shape of an M. Each M-shaped three-dimensional nano-structure 133 includes a first peak 1332 and a second peak 1334. The first peak 1332 and the second peak 1334 substantially extend along the X direction. A first groove 1336 is defined between the first peak 1332 and the second peak 1334. A second groove 1338 is defined between two adjacent three-dimensional nano-structures 133.

The first peak 1332 and the second peak 1334 protrude out of the main body 130a. The height of the first peak 1332 and the second peak 1334 is arbitrary and can be selected according to need. In one embodiment, both the height of the first peak 1332 and that of the second peak 1334 range from about 150 nanometers to about 200 nanometers. The height of the first peak 1332 can be substantially equal to that of the second peak 1334. The highest points of the first peak 1332 and the second peak 1334 are defined as the farthest point away from the surface of the main body 130a. In one three-dimensional nano-structure 133, the highest point of the first peak 1332 is spaced from that of the second peak 1334 a certain distance ranging from about 20 nanometers to about 100 nanometers. The first peak 1332 and the second peak 1334 extend substantially along the X direction. The cross-section of the first peak 1332 and the second peak 1334 can be trapezoidal or triangular, and the shape of the first peak 1332 and the second peak 1334 can be substantially the same. In one embodiment, the cross-sections of the first peak 1332 and the second peak 1334 are triangular. In one embodiment, the first peak 1332, the second peak 1334, and the main body 130a form an integrated structure.

In each M-shaped three-dimensional nano-structure 133, the first peak 1332 and the second peak 1334 define the first groove 1336. The extending direction of the first groove 1336 is substantially the same as the extending direction of the first peak 1332 and the second peak 1334. The cross-section of the first groove 1336 is V-shaped. The depth $h_1$ of the first groove 1336 in each three-dimensional nano-structure 133 is substantially the same. The depth $h_1$ is defined as the distance between the highest point of the first peak 1332 and the lowest point of the first groove 1336. The depth of the first groove 1336 is less than the height of the first peak 1332 and the second peak 1334.

The second groove 1338 extends substantially along the extending direction of the three-dimensional nano-structures 133. The cross-section of the second groove 1338 is V-shaped or an inverse trapezium. Along the extending direction, the cross-section of the second groove 1338 is substantially the same. The depth $h_2$ of the second grooves 1338 between adjacent three-dimensional nano-structures 133 is substantially the same. The depth $h_2$ is defined as the distance between the highest point and the lowest point of the groove of the second groove 1338. The depth of the second groove 1338 is greater than the depth of the first groove 1336, and the ratio between $h_1$ and $h_2$ ranges from about 1:1.2 to about 1:3 ($1:1.2 \leq h_1:h_2 \leq 1:3$). The depth of the first groove 1336 ranges from about 30 nanometers to about 120 nanometers, and the depth of the second groove 1338 ranges from about 90 nanometers to about 200 nanometers. In one embodiment, the depth of the first groove 1336 is about 80 nanometers, and the depth of the second groove 1338 is about 180 nanometers. The depth of the first groove 1336 and the second groove 1338 can be selected according to need.

The first optical symmetric layer 140, the metallic layer 150, and the second optical symmetric layer 160 are stacked on the patterned surface of the second conductive layer 130. Furthermore, the surface of the first optical symmetric layer 140, the surface of the metallic layer 150, and the surface of the second optical symmetric layer 160 away from the active layer 120 can also form a secondary patterned surface. The secondary patterned surface is similar to the patterned surface of the second semiconductor layer 130. The secondary patterned surface also includes a plurality of secondary three-dimensional nano-structures 163, and the distribution and alignment of the secondary three-dimensional nano-structures 163 is the same as the distribution and alignment of the three-dimensional nano-structures 133.

Furthermore, if the thickness of the second optical symmetric layer 160 is thick enough, the surface of the second optical symmetric layer 160 away from the metallic layer 150 can be planar.

The semiconductor structure 30 has many advantages. First, the plurality of three-dimensional nano-structures 133 change the motion direction of the photons reaching the light emitting surface with a large incident angle, so that these photons can be extracted from the light emitting surface. Second, the metallic plasma can be scattered by the plurality of well aligned three-dimensional nanostructures on the metallic layer 150. Thus, the metallic plasma can be easily extracted. Third, because the three-dimensional nano-structure 133 is M-shaped, the M-shaped three-dimensional nano-structures 133 can function as two layers of the three-dimensional nano-structure assembled together. The light extraction efficiency of the semiconductor structure 30 will be improved.

Furthermore, the plurality of three-dimensional nano-structures can also be applied on the surface of the first semiconductor layer 120 adjacent to the active layer 130. Therefore, the contact area between the first semiconductor layer 120 and the active layer 130 can be enlarged. The electron-hole recombination density is improved, and the quantity of photons is increased. The light extraction efficiency of the semiconductor structure 30 can be improved.

Figure 7:
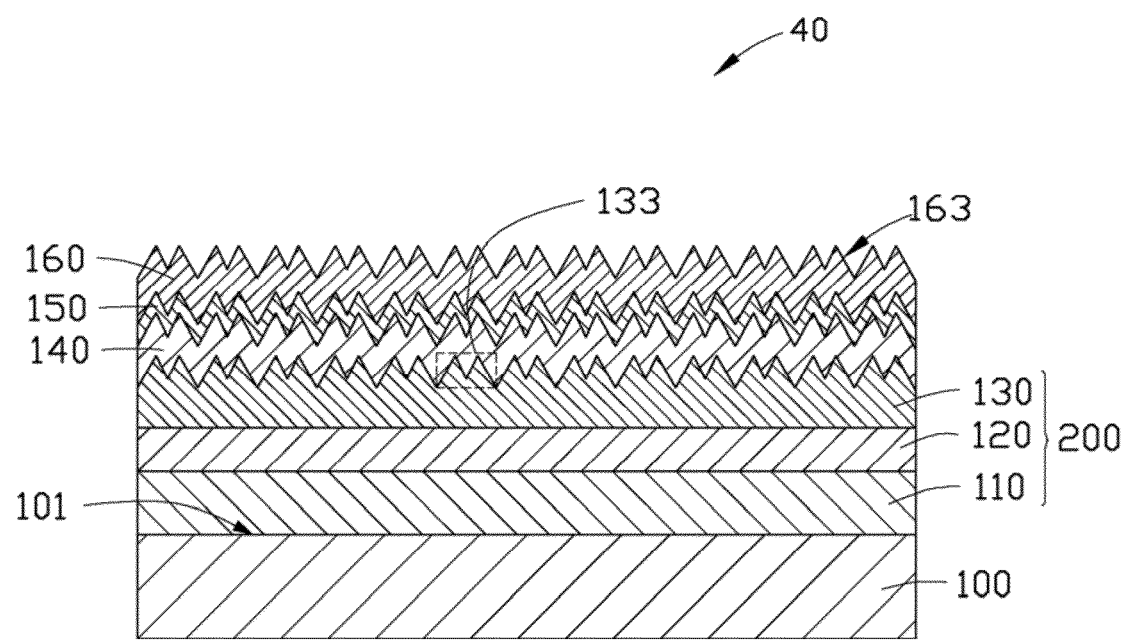
FIG. 7 is a schematic sectional view of one embodiment of a semiconductor structure.

Also referring to FIG. 7, one embodiment of a semiconductor structure 40 includes a substrate 100 having an epitaxial growth surface 101, a composite semiconductor layer 200, a first optical symmetric layer 140, a metallic layer 150, and a second optical symmetric layer 160. The composite semiconductor layer 200, the first optical symmetric layer 140, the metallic layer 150, and the second optical symmetric layer 160 are stacked on the epitaxial growth surface 101 in the that sequence. The composite semiconductor layer 200 includes a first semiconductor layer 110, an active layer 120, and a second semiconductor layer 130. The first semiconductor layer 110 is adjacent to the substrate 100. The semiconductor structure 40 is similar to the semiconductor structure 10, except that a plurality of three-dimensional nanostructures 133 can be applied on the surface of the second semiconductor layer 130 away from the active layer 120.

Figure 8:
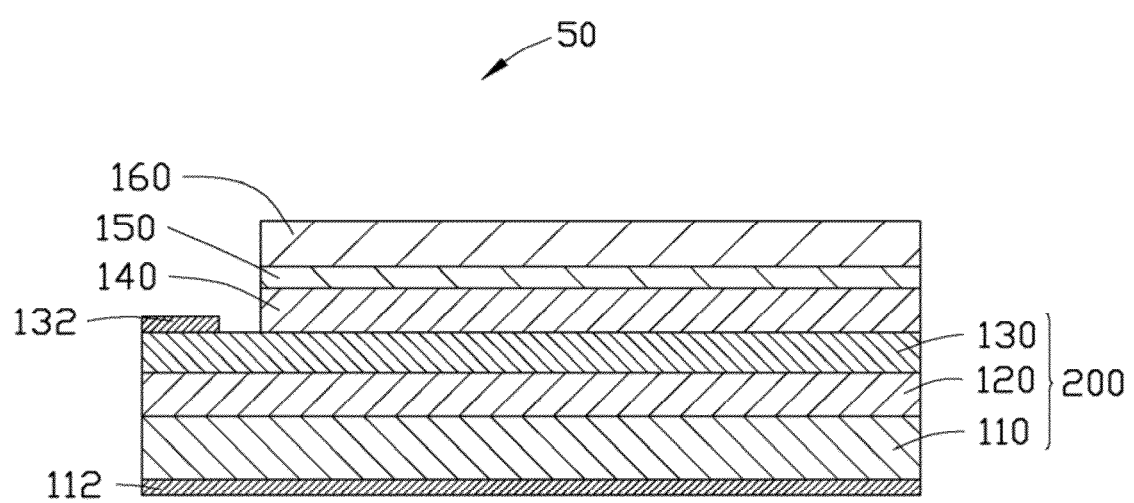
FIG. 8 is a schematic view of one embodiment of an LED.

Also referring to FIG. 8, one embodiment of an LED 50 using the semiconductor structure 20 includes a first semiconductor layer 110, an active layer 120, a second semiconductor layer 130, a first optical symmetric layer 140, a metallic layer 150, and a second optical symmetric layer 160 stacked in that order. A first electrode 112 covers and directly contacts a surface of the first semiconductor layer 110 away from the active layer 120. A second electrode 132 is electrically connected to the second conductor layer 130. In one embodiment, a part surface of the second semiconductor layer 130 is exposed, and the second electrode 132 is located on the exposed surface of the second semiconductor layer 130. The effective refractive index $n_1$ of the second optical symmetric layer 160 is similar to the effective refractive index $n_2$ of an integrated structure including the first semiconductor layer 110, the active layer 120, the second semiconductor layer 130, and the first optical symmetric layer 140. A difference $\Delta n$ between the $n_1$ and $n_2$ is greater than and equal to 0 and smaller than 0.5.

The first electrode 112 is electrically connected with the first semiconductor layer 110. The first electrode 112 can cover the entire surface of the first semiconductor layer 110 away from the active layer 120. Thus the LED 50 forms a vertical structure, and the current diffusion speed will be improved and the heat produced in the LED 50 will be decreased. The first electrode 112 is a single layer structure or a multi-layer structure. The first electrode 112 can be an N-type electrode or a P-type electrode according the first semiconductor layer 110. The material of the first electrode 112 can be selected from Ti, Ag, Al, Ni, Au, or any combination of them. The material of the first electrode 112 can also be indium-tin oxide (ITO) or carbon nanotube film. In one embodiment, the first electrode 112 is a two-layer structure consisting of a Ti layer with about 15 nm in thickness and an Au layer with about 100 nm in thickness.

The second electrode 132 can be an N-type electrode or a P-type electrode. The type of the second electrode 132 is the same as the second semiconductor layer 130. The shape of the second electrode 132 is arbitrary and can be selected according to need. The second electrode 132 covers at least part of the surface of the second semiconductor layer 130. The second electrode 130 can cover at least part of the three-dimensional nano-structures 142. The shape and the location of the second electrode 132 cannot affect the light extraction efficiency of the LED 50. The second electrode 132 is a single layer structure or a multi-layer structure. The material of the second electrode 132 can be selected from Ti, Ag, Al, Ni, Au or any combination of them. The material of the second electrode 132 can also be ITO. In one embodiment, the second electrode 132 is transparent to reduce the reflectivity and the absorption, thus improving the light extraction efficiency.

Furthermore, a reflector (not shown) can be located on the surface of first electrode 112 away from the first semiconductor layer 110. The material of the reflector can be selected from titanium (Ti), silver (Ag), aluminum (Al), nickel (Ni), gold (Au) or any combination thereof. The reflector includes a smooth surface having a high reflectivity. The photons reach the reflector and will be reflected by the reflector, thus these photons can be extracted out of the LED 50, and the light extraction efficiency of the LED 50 can be improved.

Figure 9:
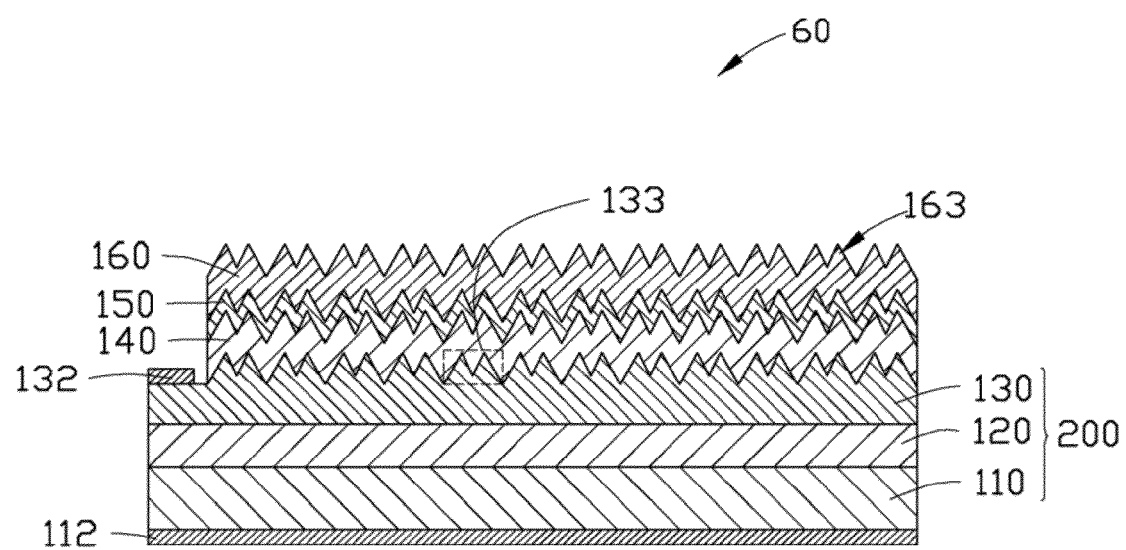
FIG. 9 is a schematic view of one embodiment of an LED.

Also referring to FIG. 9, one embodiment of an LED 60 using the semiconductor structure 30 includes a first semiconductor layer 110, an active layer 120, a second semiconductor layer 130, a first optical symmetric layer 140, a metallic layer 150, and a second optical symmetric layer 160 stacked in that order. A first electrode 112 covers and directly contacts a surface of the first semiconductor layer 110 away from the active layer 120. A second electrode 132 is electrically connected to the second conductor layer 130.

Figure 10:
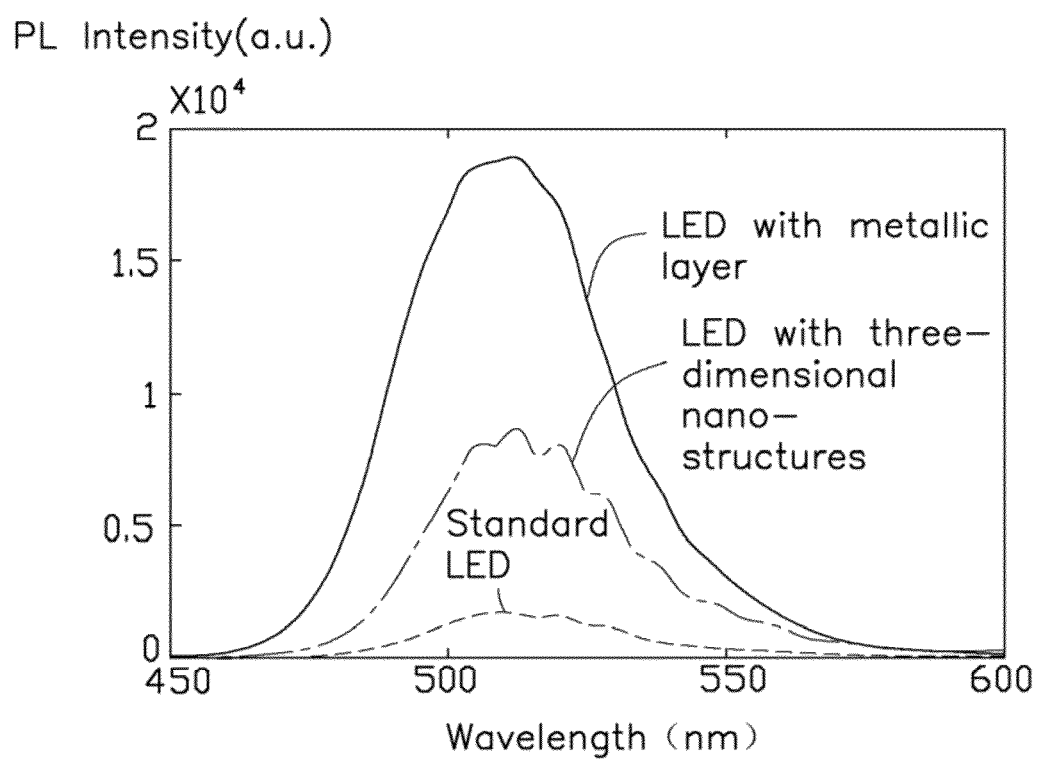
FIG. 10 is a figure that shows the luminous efficiency of one embodiment of an LED with a metallic layer, the luminous efficiency of an LED with a three-dimensional nanostructure array, and the luminous efficiency of a standard LED.

The structure of the LED 60 is similar to the structure of the LED 50, except that the second semiconductor layer 130 further includes a plurality of three-dimensional nano-structures 133. The plurality of three-dimensional nano-structures 133 is applied on the surface of the second semiconductor layer 130 away from the active layer 120. The structure of the plurality of three-dimensional nano-structures 133 of the LED 60 is similar to that in the semiconductor structure 30. Thus the light extractive efficiency of the LED 60 will be improved. Referring to FIG. 10, the light extractive efficiency of the LED 60 is much greater than that of the standard LED and the standard only with three-dimensional nano-structures.

Furthermore, the plurality of three-dimensional nano-structures can also be applied on a surface of the first semiconductor layer 110 adjacent to the active layer 120, or a surface of the active layer 120 adjacent to the second semiconductor layer 130. Therefore, the contact area between the first semiconductor layer 120 and the active layer 130, or between the second semiconductor layer 130 and the active layer 130, can be enlarged. The electron-hole recombination density is improved, and the quantity of photons is increased. The light extraction efficiency of the LED 60 can be improved.

Figure 11:
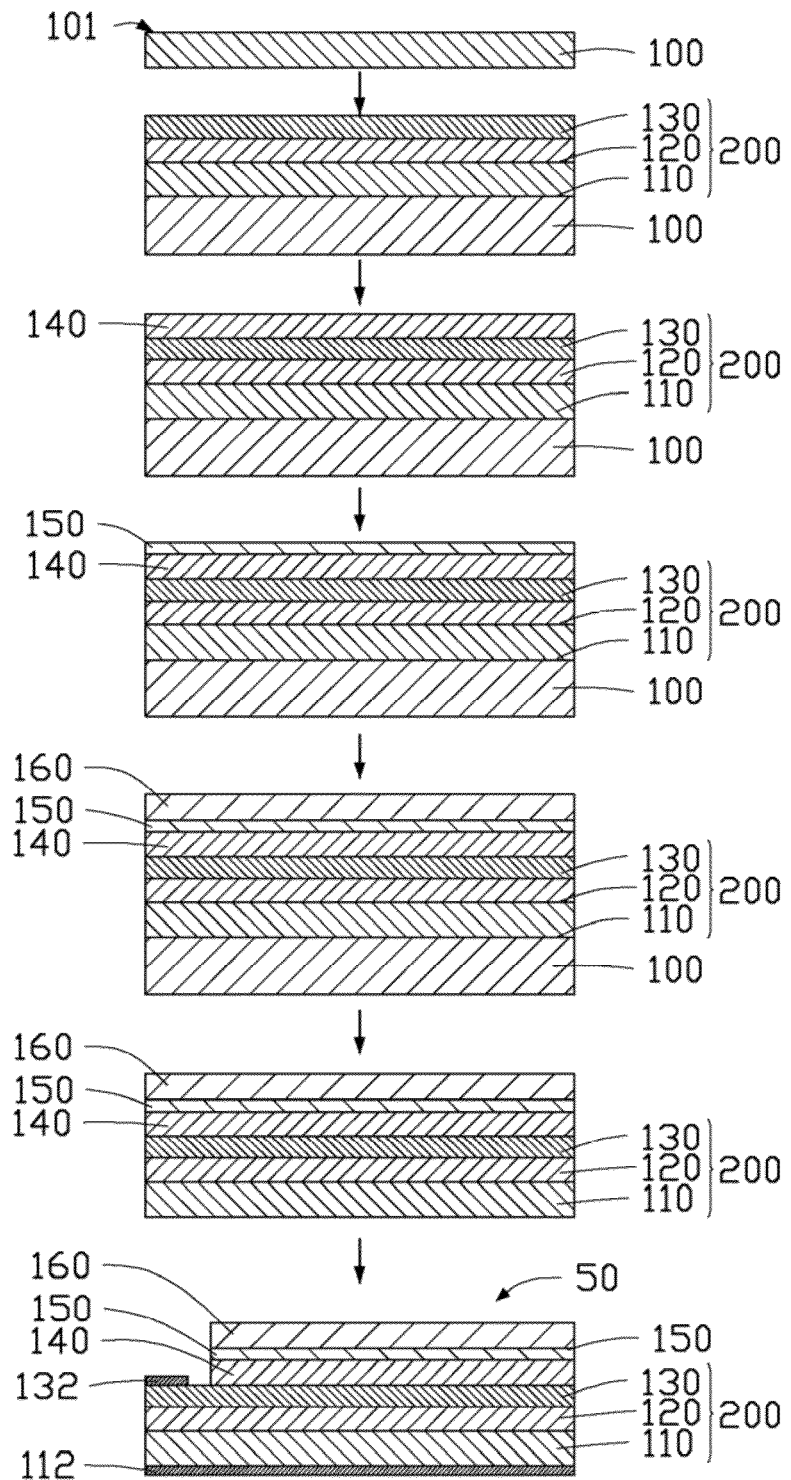
FIG. 11 is a flowchart of one embodiment of a method for making an LED.

Also referring to FIG. 11, one embodiment of a method for making the LED 50 including following steps:

(S110), providing a substrate 100 having an epitaxial growth surface 101;

(S120), growing a first semiconductor layer 110, an active layer 120 and a second semiconductor layer 130 on the epitaxial growth surface 101 in that order;

(S130), forming a first optical symmetric layer 140 on the second semiconductor layer 130;

(S140), applying a metallic layer 150 on the first optical symmetric layer 140;

(S150), forming a second optical symmetric layer 160 on the metallic layer 150;

(S160), removing the substrate 100 to expose a surface of the first semiconductor layer 110; and (S170), applying a first electrode 112 to cover the exposed surface of the first semiconductor layer 110, and a second electrode 132 electrically connected to the second semiconductor layer 130.

In step (S120), the first semiconductor layer 110, the active layer 120 and the second semiconductor layer 130 can be grown respectively via a process of molecular beam epitaxy (MBE), chemical beam epitaxy (CBE), vacuum epitaxy, low temperature epitaxy, choose epitaxy, liquid phase deposition epitaxy (LPE), metal organic vapor phase epitaxy (MOVPE), ultra-high vacuum chemical vapor deposition (UHVCVD), hydride vapor phase epitaxy (HYPE), and metal organic chemical vapor deposition (MOCVD).

In one embodiment, the first semiconductor layer 110 is an Si-doped N-type GaN. The first semiconductor layer 110 is made by a MOCVD method, and the growth of the first semiconductor layer 110 is a heteroepitaxial growth. In the MOCVD method, the nitrogen source gas is high-purity ammonia ($NH_3$), the carrier gas is hydrogen ($H_2$), the Ga source gas is trimethyl gallium (TMGa) or triethyl gallium (TEGa), and the Si source gas is silane ($SiH_4$). The growth method of the active layer 120 is similar to the first semiconductor layer 110. In one embodiment, the indium source gas is trimethyl indium. The second semiconductor layer 130 is grown after the growth of the active layer 120. In one embodiment, the Mg source gas is ferrocene magnesium ($Cp_2Mg$).

In step (S130), the first optical symmetric layer 140 can be deposited on the second semiconductor layer 130 by sputtering or vacuum evaporation. A refractive index of the first optical symmetric layer 140 can be in a range from about 1.2 to about 1.8. A material of the first optical symmetric layer 140 can be silicon dioxide, magnesium fluoride, or lithium fluoride. In one embodiment, the material of the first optical symmetric layer 140 is silicon dioxide in a thickness about 20 nanometers. The silicon dioxide is deposited on the second semiconductor layer via vacuum evaporation.

In step (S140) and step (S150), the metallic layer 150 and the second optical symmetric layer 160 can be deposited on the first optical symmetric layer 140 via sputtering or vacuum evaporation. In step (S150), an effective refractive index of the second optical symmetric layer 160 is similar to an effective refractive index of the first optical symmetric layer 160, the first semiconductor layer 110, the active layer 120, and the second semiconductor layer 130.

In step (S160), the substrate 100 can be removed by laser irradiation, etching, or thermal expansion and contraction. The removal method can be selected according to the material of the substrate 100 and the first semiconductor layer 110. In one embodiment, the substrate 100 is removed by laser irradiation. The substrate 100 can be removed from the first semiconductor layer 110 by the following steps:

(S161) polishing and cleaning the surface of the substrate 100 away from the first semiconductor layer 110;

(S162) placing the substrate 100 on a platform (not shown) and irradiating the substrate 100 and the first semiconductor layer 110 with a laser; and (S163) immersing the substrate 100 into a solvent and removing the substrate 100.

In step (S161), the substrate 100 can be polished by a mechanical polishing method or a chemical polishing method to obtain a smooth surface. Thus the scatting of the laser will be decreased. The substrate 100 can be cleaned with hydrochloric acid or sulfuric acid to remove the metallic impurities and oil.

In step (S162), the substrate 100 is irradiated by the laser from the polished surface, and the incidence angle of the laser is substantially perpendicular to the surface of the substrate 100. The wavelength of the laser is selected according to the material of the first semiconductor layer 110 and the substrate 100. The energy of the laser is smaller than the bandgap energy of the substrate 100 and larger than the bandgap energy of the first semiconductor layer 110. Thus the laser can pass through the substrate 100 and reach the interface between the substrate 100 and the first semiconductor layer 110. The buffer layer at the interface has a strong absorption of the laser, and the temperature of the buffer layer will be raised rapidly. Thus the buffer layer will be decomposed. In one embodiment, the bandgap energy of the first semiconductor layer 110 is about 3.3 ev, and the bandgap energy of the substrate 100 is about 9.9 ev. The laser is a KrF laser, the wavelength of the laser is about 248 nm, the energy is about 5 ev, the pulse width range is about 20 nanoseconds to about 40 nanoseconds, the energy density ranges from about 400 mJ/cm$^2$ to about 600 mJ/cm$^2$, and the shape of the laser pattern is square with a size of 0.5 mm×0.5 mm. The laser moves from one edge of the substrate 100 with a speed of about 0.5 mm/s During the irradiating process, the GaN is decomposed to Ga and N$_2$. It is understood that the parameter of the laser can be adjusted according to need. The wavelength of the laser can be selected according to the absorption of the buffer layer.

Because the buffer layer has a strong absorption of the laser, the buffer layer can decompose rapidly. However, the first semiconductor layer 110 has a weak absorption, so it does not decompose quickly. The irradiating process can be performed in a vacuum or a protective gas environment. The protective gas can be nitrogen, helium, argon, or other inert gas.

In step (S163), the substrate 100 can be immersed into an acidic solution to remove the Ga decomposed from GaN so that the substrate 100 can be peeled off from the first semiconductor layer 110. The acidic solution can be hydrochloric acid, sulfuric acid, or nitric acid which can dissolve the Ga.

In step (S170), the first electrode 112 and the second electrode 132 can be formed via a process of physical vapor deposition, such as electron beam evaporation, vacuum evaporation, ion sputtering, or any physical deposition. Furthermore, an conductive substrate (not shown) can be directly attached on and electrically connected to the first semiconductor layer 110, and the conductive substrate can be used as the first electrode 112.

Figure 12:
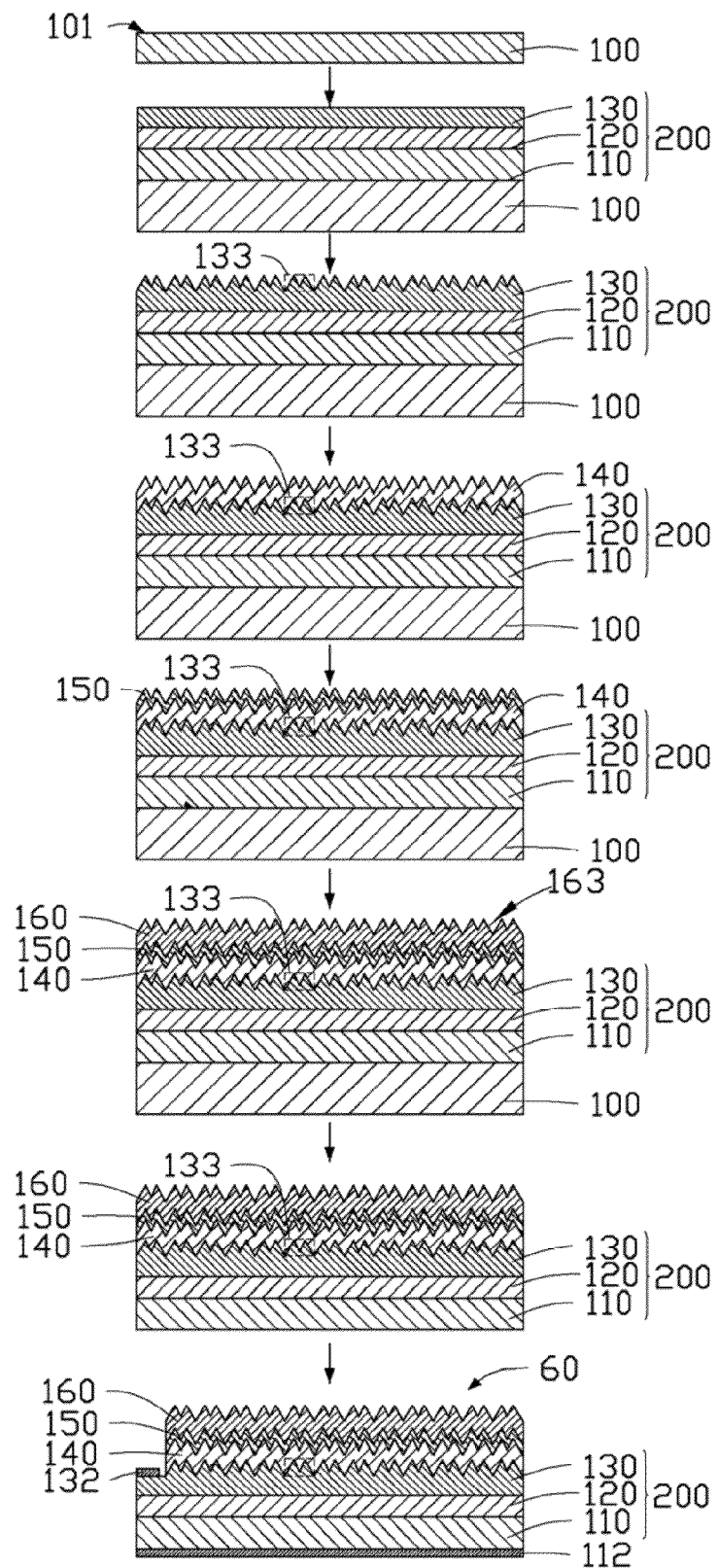
FIG. 12 is a flowchart of one embodiment of a method for making an LED.

Also referring to FIG. 12, one embodiment of a method for making the LED 60 includes:

(S210), providing a substrate 100 having an epitaxial growth surface 101;

(S220), growing a first semiconductor layer 110, an active layer 120 and a second semiconductor layer 130 on the epitaxial growth surface 101 in that order;

(S230), forming a plurality of three-dimensional nano-structures 133 on a surface of the second semiconductor layer 130 away from the active layer 120;

(S240), forming a first optical symmetric layer 140 on the plurality of three-dimensional nano-structures 133;

(S250), applying a metallic layer 150 on the first optical symmetric layer 140;

(S260), forming a second optical symmetric layer 160 on the metallic layer 150;

(S270), removing the substrate 100 to expose a surface of the first semiconductor layer 110; and (S280), applying a first electrode 112 to cover the exposed surface of the first semiconductor layer 110, and a second electrode 132 electrically connected to the second semiconductor layer 130.

The method of making the LED 60 is similar to the method of making the LED 50, except the method further comprises a step of forming a plurality of three-dimensional nano-structures 133 on the second semiconductor layer 130.

In step (S230), the plurality of three-dimensional nano-structures 133 can be formed by:

S231, locating a mask layer on the surface of the second semiconductor layer 130;

S232, patterning the mask layer by a nanoimprinting and etching method;

S233, patterning the surface of the second semiconductor layer 130 by an etching method to form a plurality of three-dimensional nano-structure performs; and S234, forming the plurality of the three-dimensional nano-structures 143 by removing the mask layer.

In step S231, the mask layer can be a single layered structure or a multi-layered structure. In one embodiment, the mask layer is the multi-layered structure including a first mask layer and a second mask layer disposed on a surface of the first mask layer. The first mask layer and the second mask layer are stacked on the surface of the second semiconductor layer 130 in sequence. A material of the first mask layer is ZEP520A® which is developed by Zeon Corp of Japan, a material of the second mask layer is HSQ (hydrogen silsesquioxane).

In step S232, the mask layer can be patterned by:

S2321, providing a patterned template which includes a plurality of protruding structures spaced from and parallel with each other, and a slot is defined between the two adjacent protruding structure;

S2322, attaching the template on the second mask layer, pressing the template at a room temperature and removing the template to form a plurality of slots on the second mask layer;

S2323, removing the residual second mask layer in the bottom of the slot to expose the first mask layer, and S2324, patterning the mask layer by removing one part of the first mask layer corresponding with the slots to expose the second semiconductor layer 130.

In step S233, the second semiconductor layer 130 can be placed in an inductively coupled plasma device and etched by an etching gas. In one embodiment, the etching gas is a mixed gas. The mixed gas can include $Cl_2$, $BCl_3$, $O_2$, and Ar. A power of the inductively coupled plasma device ranges from about 10 watts to about 100 watts, a flow speed of the etching gas ranges from about 8 sccm to about 150 sccm, a pressure of the etching gas can range from about 0.5 Pa to about 15 Pa, and an etching time can range from about 5 seconds to about 5 minutes. In one embodiment, the flow speed of the $Cl_2$ is about 26 sccm, the flow speed of the $BCl_3$ is about 16 sccm, the flow speed of the $O_2$ is about 20 sccm, and the flow speed of the Ar is about 10 sccm.

More specifically, the second semiconductor layer 130 can be etched by the following steps:

S2331, forming a plurality of grooves with the same depth by etching the surface of second semiconductor layer 130 with the etching gas;

S2332, continuing the etching process so that every two adjacent protruding structures begin to slant face to face to form a protruding pair; and S2333, further continuing the etching process so that the two adjacent protruding structures gradually slant until the tops of the two adjacent protruding structures contact each other.

In step S2331, the etching gas etches the exposed surface of the second semiconductor layer 130 to form the plurality of grooves. The grooves have the same depth because of the same etching speed. During the etching process, the etching gas will react with the exposed second semiconductor layer 130 to form a protective layer. The protective layer will reduce the etching speed of the second semiconductor layer 130, and the width of the grooves will slowly decrease from the outer surface of the second semiconductor layer 130 to the bottom of the grooves. Thus, the inner wall of the grooves will not be absolutely perpendicular to the surface of the second semiconductor layer 130, but form an angle. The etching gas not only etches the second semiconductor layer 130, but also etches the top of the protruding structures. The width of the top of the protruding structures will decrease. The resolution of the mask layer will not be affected because the speed of etching the top of the protruding structures is much smaller than that of the second semiconductor layer 130. Furthermore, every two adjacent protruding structures will slant face to face.

In step S2332, the tops of the two adjacent protruding structures will gradually approach to each other. The speed of etching the second semiconductor layer 130 corresponding to these two closed adjacent protruding structures will decrease, and the width of the grooves will gradually decrease from the outer surface of the second semiconductor layer 130 to the bottom of the grooves of the second semiconductor layer 130. Because the two adjacent protruding structures slant face to face to form the protruding pair, the speed of etching the second semiconductor layer 130 corresponding to the protruding pair will further decrease. Eventually, the tops of the two adjacent protruding structures contact each other, and the etching gas can no longer etch the second semiconductor layer 130 corresponding to the two adjacent protruding structures, thus the first grooves 1336 is formed on the surface of the second semiconductor layer 130. But between every two adjacent protruding pairs, the etching speed will change less than the etching speed between the slant two adjacent protruding structures. Thus the second grooves 1338 are formed, and the depth of the second grooves 1338 will be greater than that of the first grooves 1336. The plurality of three-dimensional nano-structure preforms is obtained.

In step S234, the three-dimensional nano-structures 143 can be obtained by dissolving the mask layer. The mask layer can be dissolved in a stripping agent such as tetrahydrofuran (THF), acetone, butanone, cyclohexane, hexane, methanol, or ethanol. In one embodiment, the stripping agent is butanone, and the mask layer is dissolved in butanone and separated from the second semiconductor layer 130.

The plurality of three-dimensional nano-structures 133 also can be formed on the surface of the active layer 120 away from the first semiconductor layer 110 or the surface of the first semiconductor layer 120 adjacent to the active layer 120 by the above method. The first optical symmetric layer 140, the metallic layer 150, and the second optical symmetric layer 160 are directly grown on the surface of the plurality of three-dimensional nanostructures 133, thus the first optical symmetric layer 140, the metallic layer 150, and the second optical symmetric layer 160 are also formed a patterned surface.

In the method for making the LED 60, the nanoimprinting and etching method is used to form the plurality of three-dimensional nano-structures 133. The nanoimpriting process can be conducted in a room temperature and the template can be directly used without being pre-treated. Therefore, the method has a simple process and low cost. In addition, a large area array of the plurality of M-shaped three-dimensional nano-structures 133 can be fabricated for the two adjacent protruding structures of the mask layer can be contact with each other by the gas etching to form the plurality of protruding pairs. Therefore, a yield of the LED 60 can be increased.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A light emitting diode comprising:
a first semiconductor layer;
an active layer on the first semiconductor layer;
a second semiconductor layer on the active layer, wherein the first semiconductor layer, the active layer, and the second semiconductor layer form a composite semiconductor layer;
a first electrode covering an entire surface of the first semiconductor layer away from the active layer;
a second electrode electrically connected to the second semiconductor layer;

a first optical symmetric layer on a surface of the second semiconductor layer away from the active layer;
a metallic layer on the first optical symmetric layer; and
a second optical symmetric layer on the metallic layer, wherein the composite semiconductor layer, and the first optical symmetric form an integrated structure; a first effective refractive index $n_1$ of the second optical symmetric layer and a second effective refractive index $n_2$ of the integrated structure satisfy $|n_1-n_2|\leq 0.5$.

2. The light emitting diode of claim 1, wherein an refractive index of the metallic layer is a complex number comprising a real part and an imaginary part, and the imaginary part is greater than or smaller than 0, and a dielectric constant of the metallic layer is a complex number comprising a real part and an imaginary part, and the real part of the dielectric constant is a negative number.

3. The light emitting diode of claim 1, wherein a material of the metallic layer is selected from the group consisting of gold, silver, aluminum, copper, and an alloy thereof.

4. The light emitting diode of claim 1, wherein a refractive index of the first optical symmetric layer is smaller than a refractive index of the composite semiconductor layer.

5. The light emitting diode of claim 1, wherein a material of the first optical symmetric layer is selected from the group consisting of silicon dioxide, magnesium fluoride, and lithium fluoride.

6. The light emitting diode of claim 1, wherein a thickness of the first optical symmetric layer is in a range from about 5 nanometers to about 40 nanometers.

7. The light emitting diode of claim 1, wherein a refractive index of the first optical symmetric layer is in a range from about 1.2 to about 1.8.

8. The light emitting diode of claim 1, wherein a difference $\Delta n_1$ between a refractive index of the second symmetric layer and a refractive index of the composite semiconductor layer is greater than 1.0 and smaller than 3.0.

9. The light emitting diode of claim 1, wherein a material of the second optical symmetric layer is selected from the group consisting of silicon, titanium dioxide, hafnium oxide, zirconia, yttria, and polyimide.

10. The light emitting diode of claim 1, wherein a refractive index of the second optical symmetric layer is greater than a refractive index of the composite semiconductor layer.

11. The light emitting diode of claim 10, wherein the refractive index of the second optical symmetric layer is in a range from about 2.5 to about 3.4.

12. The light emitting diode of claim 11, wherein a thickness of the second optical symmetric layer is in a range from about 0.5 nanometers to about 9 nanometers.

13. The light emitting diode of claim 1, wherein a refractive index of the second optical symmetric layer is smaller than a refractive index of the composite semiconductor layer.

14. The light emitting diode of claim 13, wherein the refractive index of the second optical symmetric layer is in a range from about 1.2 to about 2.5.

15. The light emitting diode of claim 14, wherein a thickness of the second optical symmetric layer is in a range from about 50 nanometers to about 300 nanometers.

16. The light emitting diode of claim 1, further comprising a plurality of first three-dimensional nano-structures on a surface of the second semiconductor layer away from the active layer.

17. The light emitting diode of claim 16, wherein the plurality of first three-dimensional nano-structures is aligned side by side, and each of the plurality of first three-dimensional nano-structures has a first peak and a second peak aligned side by side, a first groove is defined between the first peak and the second peak, a second groove is defined between every two adjacent first three-dimensional nano-structures, a depth of the first groove is smaller than a depth of the second groove, and a cross section of each of the plurality of the first three-dimensional nano-structures is M-shaped.

18. The light emitting diode of claim 16, wherein the first optical symmetric layer, the metallic layer, and the second optical symmetric layer are stacked on the plurality of first three-dimensional nano-structures.

19. The light emitting diode of claim 18, wherein each of the first optical symmetric layer, the metallic layer, and the second optical symmetric layer comprises a plurality of secondary three-dimensional nano-structures at a surface away from the active layer, and a distribution and alignment of the secondary three-dimensional nano-structures is the same as the distribution and alignment of the first three-dimensional nano-structures.

20. The light emitting diode of claim 16, further comprising a plurality of third three-dimensional nanostructures on a surface of the first semiconductor layer and a surface of the active layer away from the first electrode.

* * * * *